United States Patent
Lee et al.

(10) Patent No.: US 10,458,851 B2
(45) Date of Patent: Oct. 29, 2019

(54) SYSTEMS AND METHODS FOR THERMAL IMAGING OF RF SIGNALS

(71) Applicant: Keysight Technologies, Inc., Santa Rosa, CA (US)

(72) Inventors: Gregory Steven Lee, Mountain View, CA (US); Douglas Michael Baney, Los Altos, CA (US); Todd Steven Marshall, Los Gatos, CA (US); Gregory Douglas VanWiggeren, San Jose, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 15/887,994

(22) Filed: Feb. 3, 2018

(65) Prior Publication Data

US 2019/0242755 A1    Aug. 8, 2019

(51) Int. Cl.
*G01J 5/08*      (2006.01)
*G01J 5/00*      (2006.01)
*H04B 17/29*    (2015.01)
*H04B 17/17*    (2015.01)
*G01J 4/02*      (2006.01)
(Continued)

(52) U.S. Cl.
CPC ............... *G01J 5/0837* (2013.01); *G01J 4/02* (2013.01); *G01J 4/04* (2013.01); *G01J 5/0066* (2013.01); *H04B 17/17* (2015.01); *H04B 17/29* (2015.01); *G01J 5/10* (2013.01); *G01J 2005/0077* (2013.01); *G01J 2005/103* (2013.01)

(58) Field of Classification Search
CPC .......... G01J 5/0837; G01J 5/0066; G01J 5/10; G01J 4/02; G01J 4/04; G01J 2005/103; H04B 17/17; H04B 17/29
See application file for complete search history.

(56) References Cited

U.S. PATENT DOCUMENTS 7,030,453 B1    4/2006   Agnese
7,501,636 B1 *   3/2009   Son ........................... G01J 5/02
                                                    250/370.14

(Continued)

OTHER PUBLICATIONS

Peter Krenz et. al., "Orthogonal Infrared Dipole Antenna," Science Direct, article published on May 30, 2014.

(Continued)

*Primary Examiner* — Michael C Bryant

(57) ABSTRACT

Illustrative embodiments disclosed herein pertain to a thermal imaging system that includes a thermal imaging sheet having an array of thermal unit cells for generating a thermal footprint in response to receiving an RF signal. The thermal footprint is composed of an array of hotspots having a first set of hotspots indicative of a radiation characteristic of a first polarization component of the RF signal, and a second set of hotspots indicative of a radiation characteristic of a second polarization component of the RF signal. Each thermal unit cell includes a first RF antenna and a second RF antenna oriented orthogonal with respect to each other. The first RF antenna includes a terminating resistor that generates a hotspot among the first set of hotspots and the second RF antenna includes another terminating resistor that generates a hotspot in the second set of hotspots.

20 Claims, 14 Drawing Sheets

(51) Int. Cl.
*G01J 4/04* (2006.01)
*G01J 5/10* (2006.01)

(56) References Cited

U.S. PATENT DOCUMENTS

| | | | |
|---|---|---|---|
| 7,615,787 B2* | 11/2009 | Ouchi | G01J 3/0256 |
| | | | 257/76 |
| 9,360,375 B2 | 6/2016 | Rodriguez | |
| 10,209,284 B2* | 2/2019 | Gienger | G01R 29/105 |
| 2012/0091342 A1* | 4/2012 | Berger | G01J 5/0837 |
| | | | 250/338.4 |
| 2013/0082181 A1* | 4/2013 | Corcos | G01J 5/34 |
| | | | 250/349 |
| 2013/0082345 A1* | 4/2013 | Corcos | G01J 5/0837 |
| | | | 257/467 |

OTHER PUBLICATIONS

Alexander Cuadrado et. al., "Polarimetric Pixel Using Seebeck Nanoantennas," Optics Express, article published on May 30, 2014.
J.M. Gonzalez-Arbesu et. al., "Some Applications of Infrared Thermography for Antenna Characterization in the Polytechnic University of Catalonia" Conference Paper, Jan. 2004.

\* cited by examiner

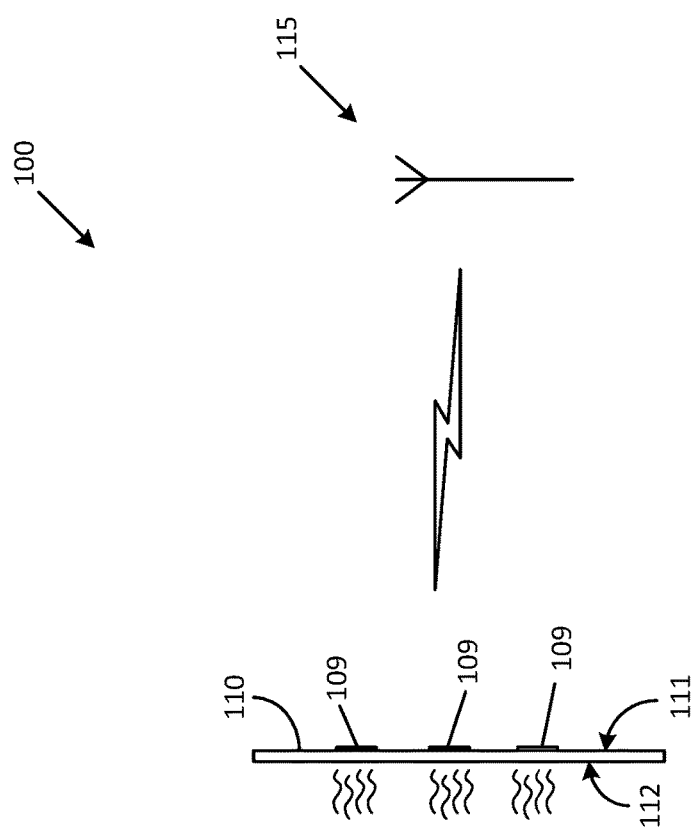
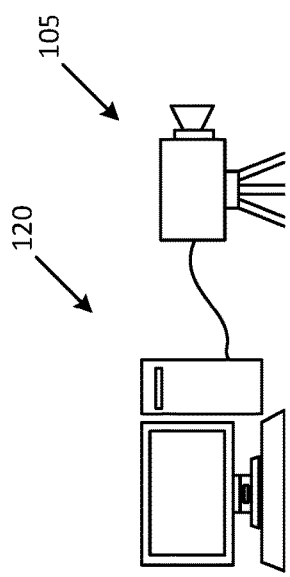
FIG. 1

SYSTEMS AND METHODS FOR THERMAL IMAGING OF RF SIGNALS

BACKGROUND

Radio-frequency (RF) antennas are ubiquitously employed for transmitting RF signals from a wide range of devices. The signal radiation characteristics of an RF antenna is often determined by the type of application in which the RF antenna is used. For example, a radio station or a cellular signal broadcasting system would typically use an RF antenna having an omnidirectional signal radiation characteristic so as to provide signal coverage over a wide area all around the antenna. However, an RF antenna that is used to provide a communication link between a spacecraft and a ground station may use an RF antenna having a narrow signal radiation pattern so as to obtain longer signal reach in a specific direction between the spacecraft and the ground station.

The radiation characteristics of these various types of antenna may be evaluated in various ways. For example, in a first approach, a RF test antenna is configured to receive an RF signal from an RF antenna. The RF test antenna is used to detect a received signal strength at various locations and the results used to generate a radiation pattern that provides information pertaining to the radiation characteristics of the RF antenna.

In another traditional approach, a test instrument incorporating a bolometer may be used for testing an RF antenna. The bolometer operates on the principle of determining a signal strength of a received RF signal based on measuring a change in resistance in a detector element (a diode or a resistor, for example) as a result of heating of the detector element by the RF signal. The change in resistance can be measured by using a Wheatstone bridge that provides good sensitivity for measuring small changes in the amplitude of electrical current flowing through the detector element. The changes in amplitude of the electrical current flow is indicative of changes in signal strength of the received RF signal. Accordingly, the test instrument incorporating the bolometer can be used for testing RF signal strength at various locations and at various times as desired.

While traditional approaches such as the ones described above may be suitable for testing an antenna in a test chamber or for testing an antenna after the antenna is installed at a site, such types of testing may prove unsuitable for rapidly evaluating a batch of RF antennas in a manufacturing line, particularly when each RF antenna is located inside a device such as a smartphone, for example. It is therefore desirable to provide a system that can be used to evaluate a number of RF antennas rapidly in a pass-fail type of test for example. It may also be desirable that the test provide information not only pertaining to signal strength of a received RF signal but also additional information such as polarization characteristics of the received RF signal.

SUMMARY

According to one exemplary embodiment of the disclosure, a thermal imaging system includes a thermal imaging sheet and a support sheet that is attached to the thermal imaging sheet. The thermal imaging sheet generates a thermal footprint in response to a radio-frequency (RF) signal incident upon an array of thermal unit cells located on the thermal imaging sheet. Each thermal unit cell in the array of thermal unit cells includes a first RF antenna having a first conductor, a second conductor, and a first terminating resistor connected between adjacent ends of the first conductor and the second conductor.

According to another exemplary embodiment of the disclosure, a thermal imaging system includes a thermal imaging sheet having an array of thermal unit cells that generate a thermal footprint in response to a radio-frequency (RF) signal received from an RF antenna. The thermal footprint has a first set of hotspots that indicate a radiation characteristic of a first polarization component of the RF signal, and a second set of hotspots that indicate a radiation characteristic of a second polarization component of the RF signal. Each thermal unit cell in the array of thermal unit cells has a first conductor, a second conductor, and a first terminating resistor connected between adjacent ends of the first conductor and the second conductor. Each thermal unit cell also has a third conductor, a fourth conductor, and a second terminating resistor connected between adjacent ends of the third conductor and the fourth conductor.

According to yet another exemplary embodiment of the disclosure, a method for thermal imaging includes receiving a radio-frequency (RF) signal on a thermal imaging sheet of a thermal imaging system, and generating a first thermal footprint on the thermal imaging sheet in response to receiving the RF signal. The first thermal footprint comprises a pair of hotspots generated by a thermal unit cell. The thermal unit cell comprises a first RF antenna having a first conductor, a second conductor, and a first terminating resistor connected between adjacent ends of the first conductor and the second conductor, wherein the first terminating resistor generates a first hotspot in the pair of hotspots; and further comprises a second RF antenna having a third conductor, a fourth conductor, and a second terminating resistor connected between adjacent ends of the third conductor and the fourth conductor. The second RF antenna is arranged in a T-configuration with respect to the first RF antenna, and the second terminating resistor generates a second hotspot in the pair of hotspots.

Other embodiments and aspects of the disclosure will become apparent from the following description taken in conjunction with the following drawings.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure. The drawings are not necessarily drawn to scale; emphasis instead being placed upon illustrating the principles of the invention. The drawings should not be interpreted as limiting the scope of the invention to the example embodiments shown herein.

FIG. 1 shows an exemplary thermal imaging system in accordance with an embodiment of the disclosure.

DETAILED DESCRIPTION

Figure 2:
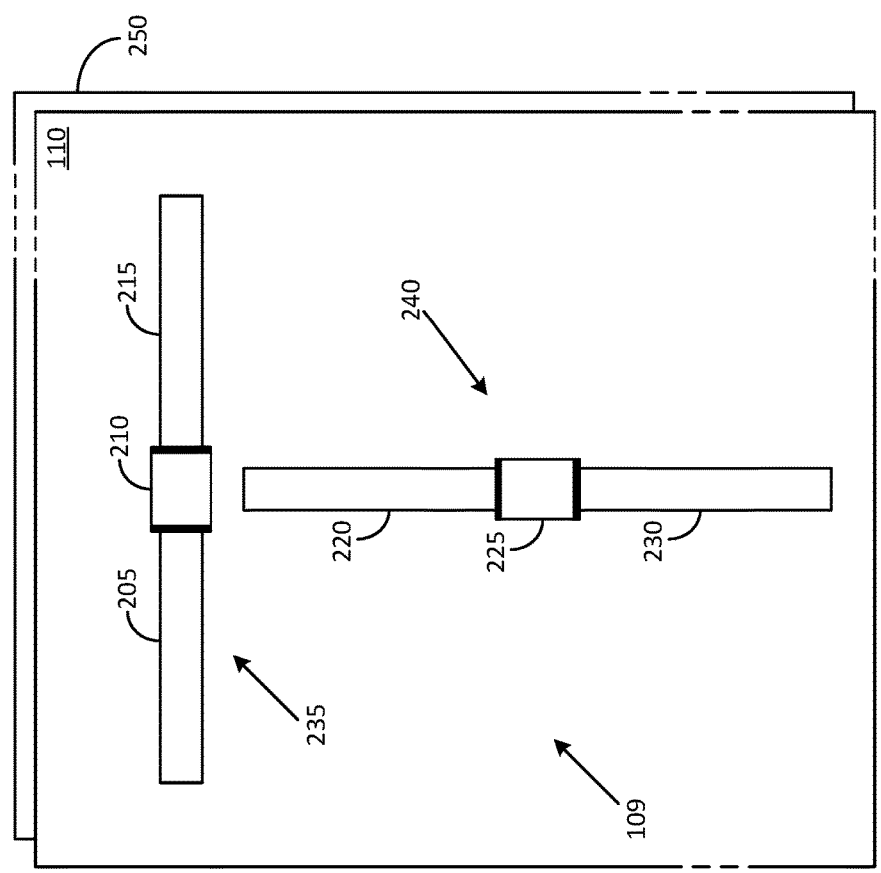
FIG. 2 shows a first exemplary thermal unit cell that can be provided upon a thermal imaging sheet that is a part of the exemplary thermal imaging system shown in FIG. 1.

Throughout this description, embodiments and variations are described for the purpose of illustrating uses and implementations of inventive concepts. The illustrative description should be understood as presenting examples of inventive concepts, rather than as limiting the scope of the concepts as disclosed herein. Towards this end, certain words and terms are used herein solely for convenience and such words and terms should be broadly understood as encompassing various objects and actions that are generally understood in various forms and equivalencies by persons of ordinary skill in the art. For example, the word "conductor" as used herein can pertain to electrical conductivity when referred to in the context of an antenna, and can refer to thermal conductivity when referred to in the context of heat (infrared emissions, for example). Words such as "oriented" and "aligned" are used to describe the relative orientation and placement of two objects with respect to each other. It should also be understood that the word "example" as used herein is intended to be non-exclusionary and non-limiting in nature. More particularly, the word "exemplary" as used herein indicates one among several examples and it should be understood that no special emphasis, exclusivity, or preference, is associated or implied by the use of this word.

In terms of an overview, the various illustrative systems and methods disclosed herein pertain to a thermal imaging system that includes a thermal imaging sheet having an array of thermal unit cells for generating a thermal footprint in response to receiving an RF signal. The thermal footprint is composed of an array of hotspots having a first set of hotspots indicative of a radiation characteristic of a first polarization component of the RF signal, and a second set of hotspots indicative of a radiation characteristic of a second polarization component of the RF signal. Each thermal unit cell includes a first RF antenna and a second RF antenna oriented orthogonal with respect to each other. The first RF antenna includes a terminating resistor that generates a hotspot among the first set of hotspots and the second RF antenna includes another terminating resistor that generates a hotspot in the second set of hotspots.

FIG. 1 shows an exemplary thermal imaging system 100 in accordance with an embodiment of the disclosure. The exemplary thermal imaging system 100 includes a thermal imaging sheet 110, a computer system 120, an infrared (IR) imaging camera 105, and an RF antenna 115. The thermal imaging sheet 110, which may be mounted on a fixture (not shown) and/or incorporated into various types of devices or instruments, is arranged to receive a radio-frequency (RF) signal from the RF antenna 115, which may be an antenna-under-test. The RF signal is incident upon an array of thermal unit cells located on a front surface 111 of the thermal imaging sheet 110. Each thermal unit cell 109 in the array of thermal unit cells includes a first RF antenna having a first terminating resistor that generates a first hotspot on a rear surface 112 of the thermal imaging sheet 110, and a second RF antenna having a second terminating resistor that generates a second hotspot on the rear surface 112 of the thermal imaging sheet 110. The intensity of the two hotspots can be used to evaluate amplitude characteristics as well as polarization characteristics of the RF signal.

The array of thermal unit cells located on the front surface 111 of the thermal imaging sheet 110 generates an array of hotspots upon the rear surface 112 of the thermal imaging sheet 110. The array of hotspots constitutes a thermal footprint of the RF signal that can be captured in the form of an infrared image, by the infrared imaging camera 105. The infrared image captured by the infrared imaging camera 105 provides information pertaining to various RF signal radiation characteristics of the RF antenna 115. The radiation characteristics include parameters such as signal strength, signal directivity, and polarization. In contrast to this approach, various traditional thermal imaging systems typically generate a thermal image composed of colored splotches on a thermal absorber sheet. The colored splotches are crude representations of RF signal strength and often fail to provide useful additional information such as RF signal strength along different polarization axes.

The RF antenna 115, which can be an external antenna that is attachable to a device such as a radio transmitter or an internal antenna embedded inside a device such as a smartphone, is typically designed to operate over a specific band of frequencies. For example, the RF antenna 115 may be configured to operate in accordance with various cellular network standards associated with 4G and 5G. More particularly, when configured to operate in the 5G frequency band, the RF antenna 115 may be implemented in the form of a millimeter-wave phased array having a size corresponding to a postage stamp.

Testing of wireless devices (smartphones, for example) incorporating antennas such as a millimeter-wave phased array can prove challenging, particularly in a production line where it is desirable to optimize testing speed without compromising test quality. Such testing may be carried out by using the thermal imaging system 100 to carry out a pass-fail test procedure for evaluating the wireless devices in accordance with an exemplary method of the disclosure.

In one exemplary pass-fail test procedure, the infrared imaging camera 105 may be used by an operator to visually evaluate the radiation characteristics of an antenna located inside (or attached to) each wireless device among a number of wireless devices in a production line of a manufacturing facility. The operator may do so by following a pass-fail evaluation procedure that may include identifying one or more anomalies, if present, in a thermal footprint generated upon the rear surface 112 of the thermal imaging sheet 110 by an RF signal transmitted by each wireless device. Identifying the one or more anomalies can be based on the operator's skill and work experience and/or by comparing each thermal footprint against one or more template thermal footprints. The template thermal footprints can include various types of normal as well as abnormal thermal footprints. Accordingly, a first exemplary template thermal footprint that is indicative of a normal radiation characteristic of the RF signal can be generated by using a reference wireless device. A second exemplary template thermal footprint that is indicative of an abnormal radiation characteristic of the RF signal can be generated by using a defective wireless device.

Alternatively, in an automated set-up, the infrared imaging camera 105 is communicatively coupled to the computer system 120 that evaluates each device by using image processing techniques to examine the thermal footprints. Defective devices may be flagged and repaired, or discarded, based on an evaluation procedure executed by the computer system 120. In one exemplary implementation, the computer system 120 evaluates each device by comparing a thermal footprint generated upon the thermal imaging sheet 110 against one or more template thermal footprints such as the ones described above.

FIG. 2 shows a first exemplary embodiment of the thermal unit cell 109 that can be provided on the front surface 111 of the thermal imaging sheet 110 shown in FIG. 1. In this example implementation, the thermal unit cell 109 includes a first RF antenna 235 and a second RF antenna 240 arranged in a T-configuration with respect to each other. The first RF antenna 235 includes a first conductor 205, a second conductor 215, and a first terminating resistor 210 connected between adjacent ends of the first conductor 205 and the second conductor 215. The lengths of the first conductor 205 and the second conductor 215 are selected in accordance with an operating wavelength of the RF signal. For example, the overall longitudinal dimension of the first RF antenna 235 may be directly related to a half-wave length ($\lambda/2$) of the RF signal.

The second RF antenna 240 includes a third conductor 220, a fourth conductor 230, and a second terminating resistor 225 connected between adjacent ends of the third conductor 220 and the fourth conductor 230. The lengths of the third conductor 220 and the fourth conductor 230 are also selected in accordance with an operating wavelength of the RF signal. In an exemplary implementation, the overall longitudinal dimension of the second RF antenna 240 is substantially similar to the overall longitudinal dimension of the first RF antenna 235.

An exemplary RF signal transmitted by the RF antenna 115 has a first polarization component that is horizontally oriented and a second polarization component that is vertically oriented. The first RF antenna 235 operates as a first RF dipole antenna having a longitudinal axis of each of the first conductor 205 and the second conductor 215 aligned with the first polarization component of the RF signal and the second RF antenna 240 operates as a second RF dipole antenna having a longitudinal axis of each of the third conductor 220 and the fourth conductor 230 aligned with the second polarization component of the RF signal. In some implementations, the first conductor 205 and the second conductor 215 may have a vertical offset with respect to each other, and the first terminating resistor 210 may be arranged at an angle (skewed arrangement) so as to be connected to the adjacent ends of the first conductor 205 and the second conductor. Even when offset, each of the first conductor 205 and the second conductor 215 is configured to align with the first polarization component of the RF signal. The third conductor 220 and the fourth conductor 230 may have a horizontal offset with respect to each other, and the second terminating resistor 225 may be arranged at an angle (skewed arrangement) so as to be connected to the adjacent ends of the third conductor 220 and the fourth conductor 230. Even when offset, each of the third conductor 220 and the fourth conductor 230 is configured to align with the second polarization component of the RF signal.

Each of the first conductor 205, the second conductor 215, the third conductor 220 and the fourth conductor 230 are composed of a material that is not only a good conductor of electricity but is also a good conductor of heat. A few examples of such materials include a noble metal (gold, for example) and an alloy (copper, for example). The thermal imaging sheet 110 upon which the first RF antenna 235 and the second RF antenna 240 are provided may be selected of a material such as a plastic or a polyimide. The first conductor 205, the second conductor 215, the third conductor 220 and the fourth conductor 230 may be fabricated upon the thermal imaging sheet 110 by using various techniques, such as by using a liquid metal-jet printer, photolithography, and/or vapor deposition.

A support sheet 250 may be attached to the thermal imaging sheet 110, particularly when the thermal imaging sheet 110 is thin and flexible (such as when the thermal imaging sheet 110 is a plastic sheet or a polyimide sheet). However, in some implementations, the thermal imaging sheet 110 may have enough rigidity in itself so as to preclude the use of the support sheet 250.

Operatively, the first conductor 205 and the second conductor 215 receive a portion of the first polarization component of the RF signal and generate an electrical current that flows through the first terminating resistor 210 and produces heat in the first terminating resistor 210.

The heat produced in the first terminating resistor 210 generates a first hotspot on the rear surface 112 of the thermal imaging sheet 110. The first hotspot radiates thermal energy out of the rear surface 112 of the thermal imaging sheet 110 in various wavelengths, including an infrared band of wavelengths that can be captured by the infrared imaging camera 105.

A portion of the heat produced in the first terminating resistor 210 is conducted into each of the first conductor 205 and the second conductor 215. However, the material of the first conductor 205 and the second conductor 215 (a noble metal, for example) provides very low infrared emissivity. Consequently, the amount of infrared radiation generated by the first conductor 205 and the second conductor 215 upon the rear surface 112 of the thermal imaging sheet 110 is relatively small in comparison to the infrared radiation generated by the first terminating resistor 210.

The infrared radiation from the first terminating resistor 210 is proportional to a fourth power of the temperature produced in the first terminating resistor 210. The phrase "differential infrared emission" as used herein refers to a difference between infrared radiation levels emitted by the first terminating resistor 210 when the RF signal is incident upon the thermal unit cell 109 and when the RF signal is absent. The differential infrared emission of the first terminating resistor is proportional to the third power of the temperature produced in the first terminating resistor 210, and linearly proportional to the differential temperature rise in produced in the first terminating resistor 210, the latter being proportional to the incident RF signal power.

The infrared emission characteristics of the first terminating resistor 210 can be generally characterized by the following relationship:

$$dJ_{IR} = 4\sigma T^3 dT \quad \text{(Equation 1)}$$

where $dJ_{IR}$ is the differential infrared emission, $\sigma$ is the Stefan-Boltzmann constant, T is the absolute temperature, and dT is the differential temperature rise (which is proportional to the RF signal power).

The third conductor 220 and the fourth conductor 230 of the second RF antenna 240 receive a portion of the second polarization component of the RF signal that is orthogonal to the first polarization component of the RF signal, and generate an electrical current that flows through the second terminating resistor 225 and produces heat in the second terminating resistor 225. The heat produced in the second terminating resistor 225 generates a second hotspot on the rear surface 112 of the thermal imaging sheet 110. The second hotspot radiates thermal energy out of the rear surface 112 of the thermal imaging sheet 110 in various wavelengths, including an infrared band of wavelengths that can be captured by the infrared imaging camera 105. The second hotspot provides information about a strength of the second polarization component of the RF signal, which can be compared against a strength of the first polarization signal that is indicated by the first hotspot. The infrared emission characteristics of the second terminating resistor 225 is similar to that described above with reference to the first terminating resistor 210.

The thermal resistance of each of the first terminating resistor 210 and the second terminating resistor 225 is inversely proportional to the blackbody radiative cooling of the thermal imaging sheet 110 and larger than an equivalent area of the thermal imaging sheet 110 by a thermal resistance factor. The thermal resistance factor can be generally defined as $\lambda^2/(4 A_{res})$ where $A_{res}$ corresponds to an area occupied by the first terminating resistor 210 or the second terminating resistor 225 upon the thermal imaging sheet 110 when the thickness of the thermal imaging sheet 110 is negligible. The definition is based on the assumption that the infrared emissivity of the material of the thermal imaging sheet 110 is equal to the infrared emissivity of each of the first terminating resistor 210 and the second terminating resistor 225. Since the dimensions of each of the first terminating resistor 210 and the second terminating resistor 225 are significantly smaller than an operating wavelength ($\lambda$) of the RF signal, the thermal resistance factor per unit mounting area of each of the first terminating resistor 210 and the second terminating resistor 225 can be of the order of 100 to 1000 (20 to 30 dB) with respect to the equivalent area of the thermal imaging sheet 110. The unit mounting area of a surface mount resistor of packaging type 0805 (2 mm×1.3 mm) corresponds to 2.6 mm².

The thermal resistance factor can also be defined as $\lambda^2/(2 A_{ant})$ where $A_{ant}$ corresponds to a footprint of the metal portions of the thermal unit cell 109 (the first conductor 205, the second conductor 215, the third conductor 220, and the fourth conductor 230). Although $A_{ant}$ is larger than $A_{res}$, $A_{ant}$ is still smaller than the area occupied by the thermal unit cell 109 as a whole. An enhancement factor ranging from about 20 to about 30 (about 13 dB to about 15 dB) is feasible in comparison to using a traditional thermal absorber sheet that does not include the thermal unit cells described herein in accordance with the disclosure.

The thickness of the thermal imaging sheet 110, which can be a plastic sheet or a polyimide sheet (a Kapton sheet, for example), is selected to be as thin as practical, in order to minimize the thermal resistance of the thermal imaging sheet 110. An exemplary thermal imaging sheet 110 that may be used in accordance with the disclosure has a thickness ranging from about 5 microns to about 150 microns. Furthermore, unlike some traditional thermal imaging systems that incorporate a thermal absorber sheet which emits infrared radiations in both forward and backward directions, the thermal imaging sheet 110 heats up and emits infrared radiation primarily towards the infrared imaging camera 105. Portions of the infrared radiation emitted by the thermal imaging sheet 110 in the direction towards the RF antenna 115 are reflected by each of the first conductor 205, the second conductor 215, the third conductor 220, and the fourth conductor 230 backwards towards the infrared imaging camera 105.

Figure 3:
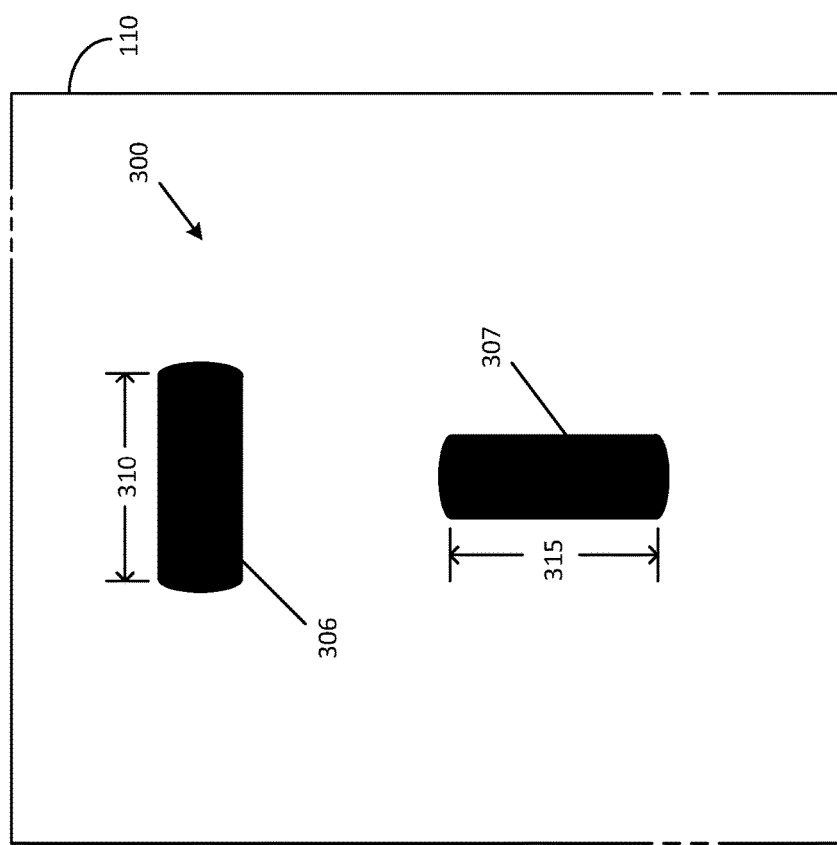
FIG. 3 illustrates an exemplary thermal pattern generated by the thermal unit cell shown in FIG. 2.

FIG. 3 shows an exemplary thermal pattern 300 generated by the thermal unit cell 109 upon the thermal imaging sheet 110 in accordance with an embodiment of the disclosure. The thermal pattern 300 includes a pair of hotspots in the form of a horizontal hotspot 306 that is generated by the first terminating resistor 210 of the first RF antenna 235, and a vertical hotspot 307 that is generated by the second terminating resistor 225 of the second RF antenna 240. The horizontal hotspot 306, which has a T-configuration with respect to the vertical hotspot 307 in this example, has a linear dimension 310 that roughly corresponds to a length of the first terminating resistor 210. The vertical hotspot 307 has a linear dimension 315 that roughly corresponds to a length of the second terminating resistor 225.

Each of the first terminating resistor 210 and the second terminating resistor 225 can be implemented in various ways. In one exemplary implementation, one or both of the first terminating resistor 210 and the second terminating resistor 225 is a leaded resistor. In another exemplary implementation, one or both of the first terminating resistor 210 and the second terminating resistor 225 is fabricated as an integrated resistor (diffused resistor, epitaxial resistor, thin-film deposition etc.) upon the thermal imaging sheet 110. In yet other exemplary implementation, one or both of the first terminating resistor 210 and the second terminating resistor 225 is a surface mount resistor (SMT). A few examples of surface mount resistors that may be used are shown below in Table 1.

TABLE 1

Common Surface Mount Resistor Package Dimensions

| SMT Package Style | Size (mm) | Size (inches) |
|---|---|---|
| 2512 | 6.30 × 3.10 | 0.25 × 0.12 |
| 2010 | 5.00 × 2.60 | 0.20 × 0.10 |
| 1812 | 4.6 × 3.0 | 0.18 × 0.12 |
| 1210 | 3.20 × 2.60 | 0.12 × 0.10 |
| 1206 | 3.0 × 1.5 | 0.12 × 0.06 |
| 0805 | 2.0 × 1.3 | 0.08 × 0.05 |
| 0603 | 1.5 × 0.08 | 0.06 × 0.03 |
| 0402 | 1 × 0.6 | 0.04 × 0.02 |
| 0201 | 0.6 × 0.3 | 0.02 × 0.01 |

Figure 4:
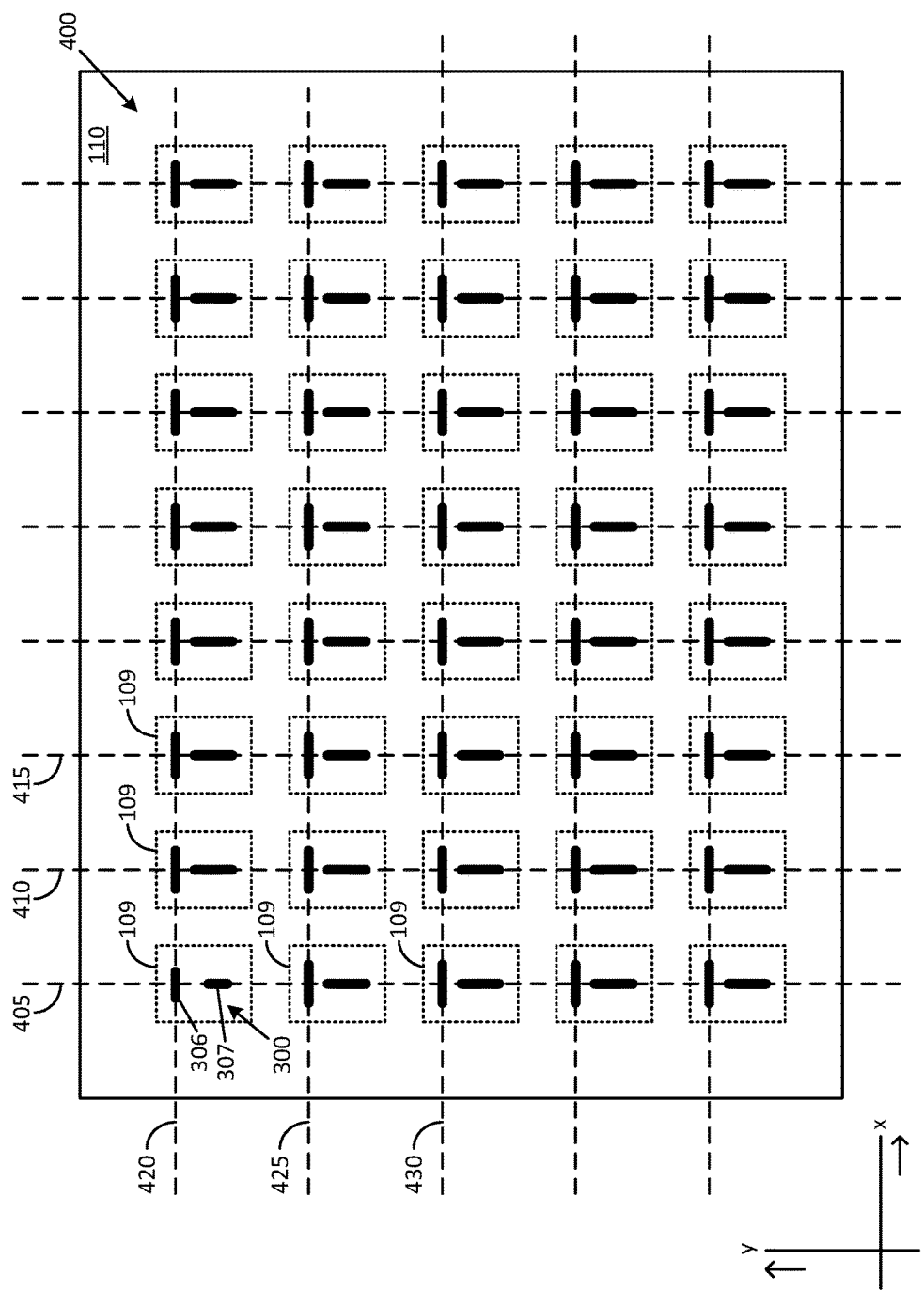
FIG. 4 shows a first exemplary thermal footprint generated upon the thermal imaging sheet that is shown in FIG. 2.

FIG. 4 shows a first exemplary thermal footprint 400 generated by an array of thermal unit cells provided on the front surface 111 of the thermal imaging sheet 110 in accordance with an embodiment of the disclosure. The exemplary thermal footprint 400 includes an array of thermal patterns wherein each thermal pattern is substantially identical to the thermal pattern 300 shown in FIG. 3. The thermal footprint 400 has a rectangular grid configuration that includes a number of rows (such as a first row 420, a second row 425, and a third row 430 each of which is parallel to a horizontal axis of the thermal imaging sheet 110) and a number of columns (such as a first column 405, a second column 410, and a third column 415 each of which is parallel to a vertical axis of the thermal imaging sheet 110). A thermal unit cell 109 is located at each intersection of a row and a column of the array. In other implementations in accordance with the disclosure, a number of thermal unit cells can be arranged in various other configurations such as a square grid configuration, a circular configuration, an oval configuration, a hexagonal configuration, or a non-patterned configuration.

An evaluation of the thermal footprint 400 by the computer system 120 for example, would indicate to the computer system 110 that the intensity of an RF signal that is incident upon the array of thermal unit cells provided on the front surface 111 of the thermal imaging sheet 110 has a uniform distribution on the thermal imaging sheet 110. The thermal footprint 400 would also indicate that the intensity distribution of the first polarization component of the RF signal is substantially identical to the intensity distribution of the second polarization component of the RF signal. The intensity distribution of the first polarization component of the RF signal may be carried out by evaluating the plurality of hotspots in each row of the thermal footprint 400. For example, the first row 420 may be examined in order to evaluate a first set of hotspots aligned with a first horizontal axis on the thermal imaging sheet 110.

The intensity distribution of the second polarization component of the RF signal, which is orthogonal to the first polarization component, may be carried out by evaluating the plurality of hotspots in each column of the thermal footprint 400. For example, the first column 405 may be examined in order to evaluate a second set of hotspots aligned with a first vertical axis on the thermal imaging sheet 110.

The computer system 120 may use one or more image processing techniques for evaluating the thermal footprint 400 generated on the thermal imaging sheet 110. In one exemplary implementation, the computer system 120 uses a map of the thermal imaging sheet 110 to obtain location information of at least a portion of the array of thermal unit cells when evaluating the thermal footprint 400. The location information may be provided in the form of x-y coordinates in the map. The x-y coordinate mapping is generally indicated in FIG. 4 in the form of the dashed lines (rows and columns). Accordingly, the computer system 120 may identify and evaluate a first hotspot generated by the first terminating resistor 210 at the top left corner of the map by using the x-y coordinates of the intersection of the first column 405 and the first row 420 to identify the thermal unit cell 109. The computer system 120 may also use location information of the first terminating resistor 210 (in place of the location information of the thermal unit cell 109) to evaluate the first hotspot in the portion of the array of thermal unit cells. The x-y coordinates of the intersection of the first column 405 and the first row 420 can be used in this example for identifying the first terminating resistor 210 in the associated thermal unit cell 109. Location information (x-y coordinates for example) may be similarly used by the computer system 120 to identify a second hotspot located below the first hotspot and generated by the second terminating resistor 225 and other hotspots in the array of hotspots.

Figure 5:
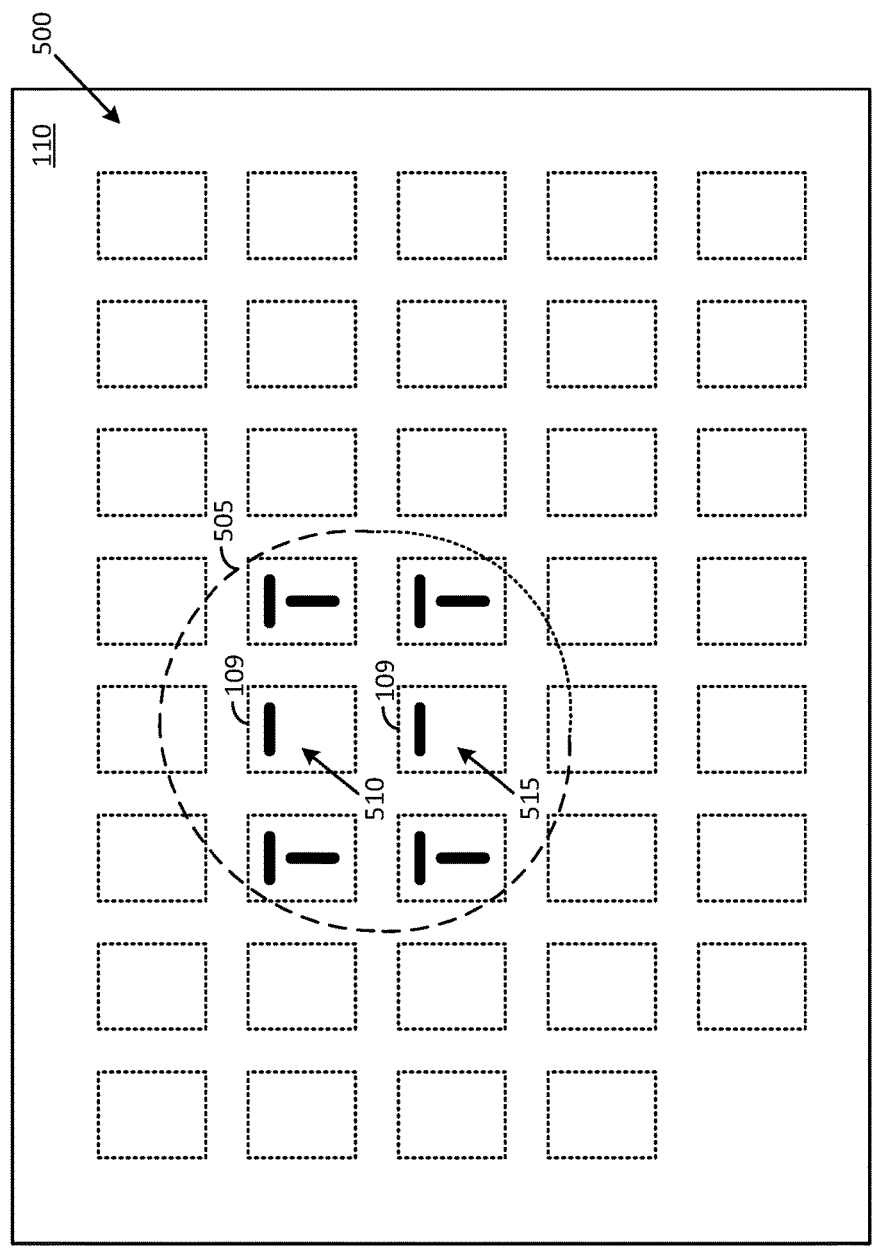
FIG. 5 shows a second exemplary thermal image generated upon the thermal imaging sheet that is shown in FIG. 2.

FIG. 5 shows a second exemplary thermal footprint 500 generated by an array of thermal unit cells provided on the front surface 111 of the thermal imaging sheet 110 in accordance with an embodiment of the disclosure. An evaluation of the thermal footprint 500 by the computer system 120 for example, would indicate to the computer system 110 that the intensity of an RF signal that is incident upon the array of thermal unit cells provided on the front surface 111 of the thermal imaging sheet 110 has a non-uniform distribution on the thermal imaging sheet 110. The RF signal is incident upon only a small number of thermal unit cells 109 located within an area 505 of the front surface 111 of the thermal imaging sheet 110.

The thermal footprint 500 also indicates that the intensity distribution of the first polarization component of the RF signal is not identical to the intensity distribution of the second polarization component of the RF signal. The difference in intensities between the two polarization components can be determined by evaluating a first thermal pattern 510 and a second thermal pattern 515, each of which fails to provide an indication of the second polarization component.

Figure 6:
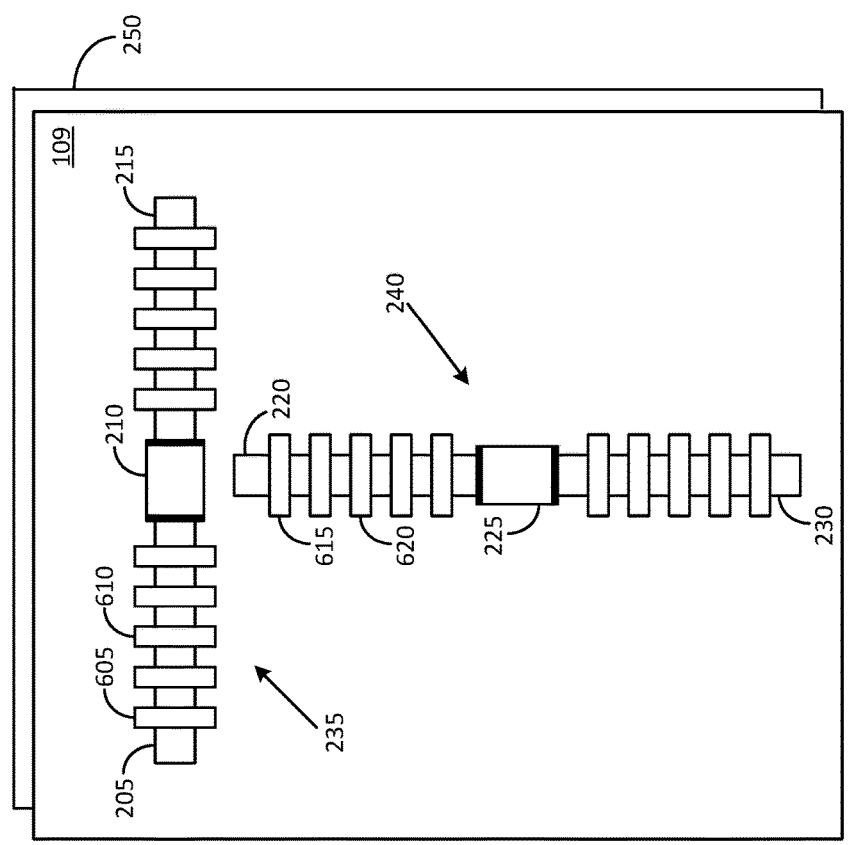
FIG. 6 shows a second exemplary thermal unit cell that can be provided upon the thermal imaging sheet that is a part of the exemplary thermal imaging system shown in FIG. 1.

FIG. 6 shows a second exemplary embodiment of the thermal unit cell 109 that can be provided on the front surface 111 of the thermal imaging sheet 110 shown in FIG. 1. In this example embodiment, the thermal unit cell 109 includes various components of the first RF antenna 235 and the second RF antenna 240 that are illustrated in FIG. 2. These components include the first conductor 205, the second conductor 215, the first terminating resistor 210, the third conductor 220, the fourth conductor 230, and the second terminating resistor 225. However, some additional components are provided in the form of a number of resistors that are placed in thermal contact with a respective one of each of the first conductor 205, the second conductor 215, the third conductor 220, and the fourth conductor 230. For example, each of resistor 605 and resistor 610 is placed in thermal contact with the first conductor 205 such that the resistors produce heat when heat is transferred to the resistors from the first conductor 205. As another example, each of resistor 615 and resistor 620 is similarly placed in thermal contact with the third conductor 220.

The manner in which resistors such as the resistor 605, the resistor 610, the resistor 615, and the resistor 620 produce heat (due to heat transfer from the conductors) is in contrast to the manner in which the first terminating resistor 210 and the second terminating resistor 225 produce heat (due to electrical current flow through each of the first terminating resistor 210 and the second terminating resistor 225).

Each resistor that is placed in thermal contact with a conductor may be arranged such that a longitudinal axis of the resistor is orthogonal to a longitudinal axis of the conductor upon which the resistor is placed. For example, a longitudinal axis of each of the resistor 605 and the resistor 610 is arranged to be orthogonal to a longitudinal axis of the first conductor 205. Similarly, a longitudinal axis of each of the resistor 615 and the resistor 620 is arranged to be orthogonal to a longitudinal axis of the third conductor 220.

In an exemplary implementation, each resistor may be soldered to a pair of solder pads (not shown) provided on either side of an associated conductor with a body portion of the resistor placed in contact with the respective conductor. In another exemplary implementation, each resistor may be affixed to an associated conductor by using an adhesive or an anchoring element (such as an indentation, a socket, or a clamp).

In another exemplary implementation, in lieu of the resistors that are placed upon a conductor, a composition of the material of each conductor may be modified in order to operate as an intrinsic resistor at various locations along the length of the conductor. For example, each of the resistor 605 and the resistor 610 may be provided in the form of intrinsic resistors. This may be carried out by adding suitable resistive material (such as another metal or an alloy) to the noble metal contained in the first conductor 205 at the locations indicated by the resistor 605 and the resistor 610 in FIG. 6 and/or by using local chemical reaction.

A width of some or all of these intrinsic resistors may be selected to match the width of the conductor upon which the intrinsic resistor is fabricated, or may be selected to exceed the width of the conductor upon which the intrinsic resistor is fabricated (for example, extending outwards on one or both sides of the conductor upon which the intrinsic resistor is fabricated).

Figure 7:
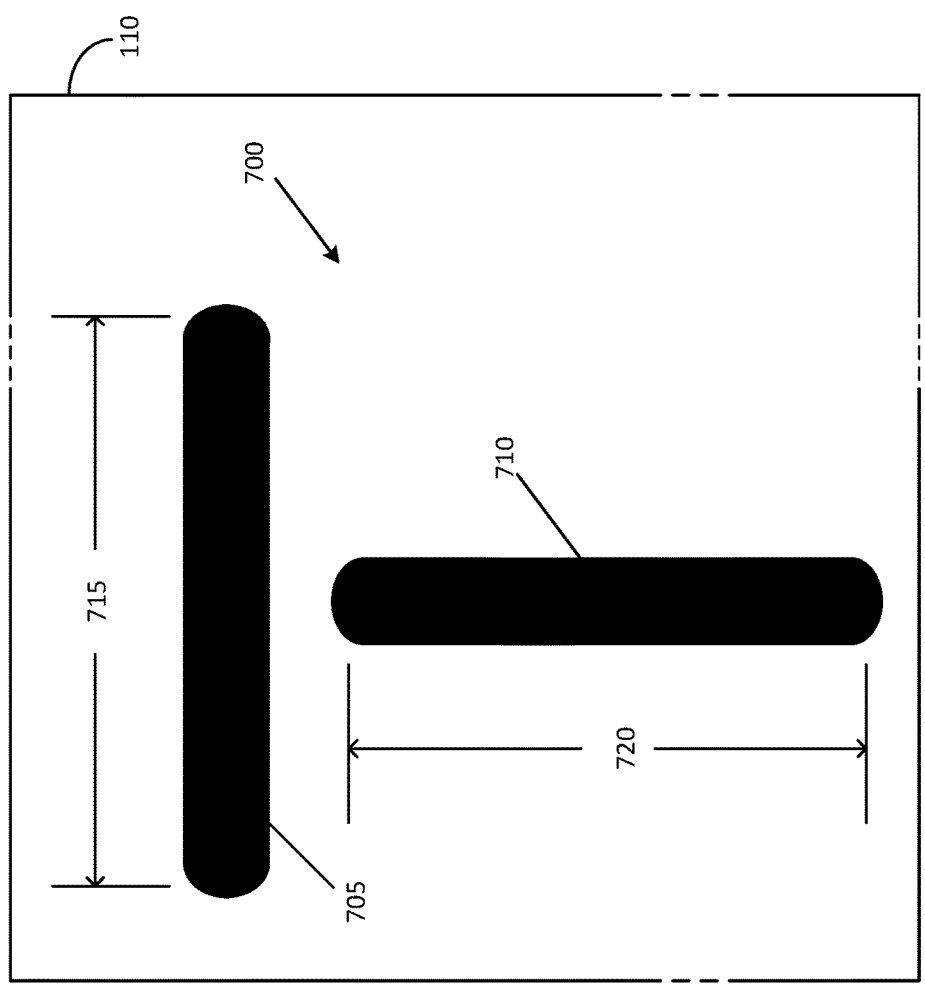
FIG. 7 shows an exemplary thermal image generated by the second exemplary thermal unit cell shown in FIG. 6.

FIG. 7 shows an exemplary thermal pattern 700 generated by the thermal unit cell 109 shown in FIG. 6. The thermal pattern 700 includes a horizontal hotspot 705 and a vertical hotspot 710. In contrast to the horizontal hotspot 306 (shown in FIG. 3) that is generated by the first terminating resistor 210 of the first RF antenna 235, the horizontal hotspot 705 is generated exclusively by the first terminating resistor 210 of the first RF antenna 235 in cooperation with the various resistors provided upon each of the first conductor 205 and the second conductor 215 of the first RF antenna 235. Similarly, in contrast to the vertical hotspot 307 (shown in FIG. 3) that is generated exclusively by the second terminating resistor 225 of the second RF antenna 240, the vertical hotspot 710 is generated by the second terminating resistor 225 of the second RF antenna 240 in cooperation with the various resistors provided upon each of the third conductor 220 and the fourth conductor 230 of the second RF antenna 240.

Accordingly, the horizontal hotspot 705 has a linear dimension 715 that substantially corresponds to a length of a combination of the first conductor 205, the first terminating resistor 210 and the second conductor 215. The vertical hotspot 710 has a linear dimension 720 that substantially corresponds to a length of combination of the third conductor 220, the second terminating resistor 225 and the fourth conductor 230. The increase in the linear dimension of each of the horizontal hotspot 705 and the vertical hotspot 710 in comparison to the horizontal hotspot 306 and the vertical hotspot 307, allows the use of a relatively low-cost, low-resolution infrared imaging camera 105.

Figure 8:
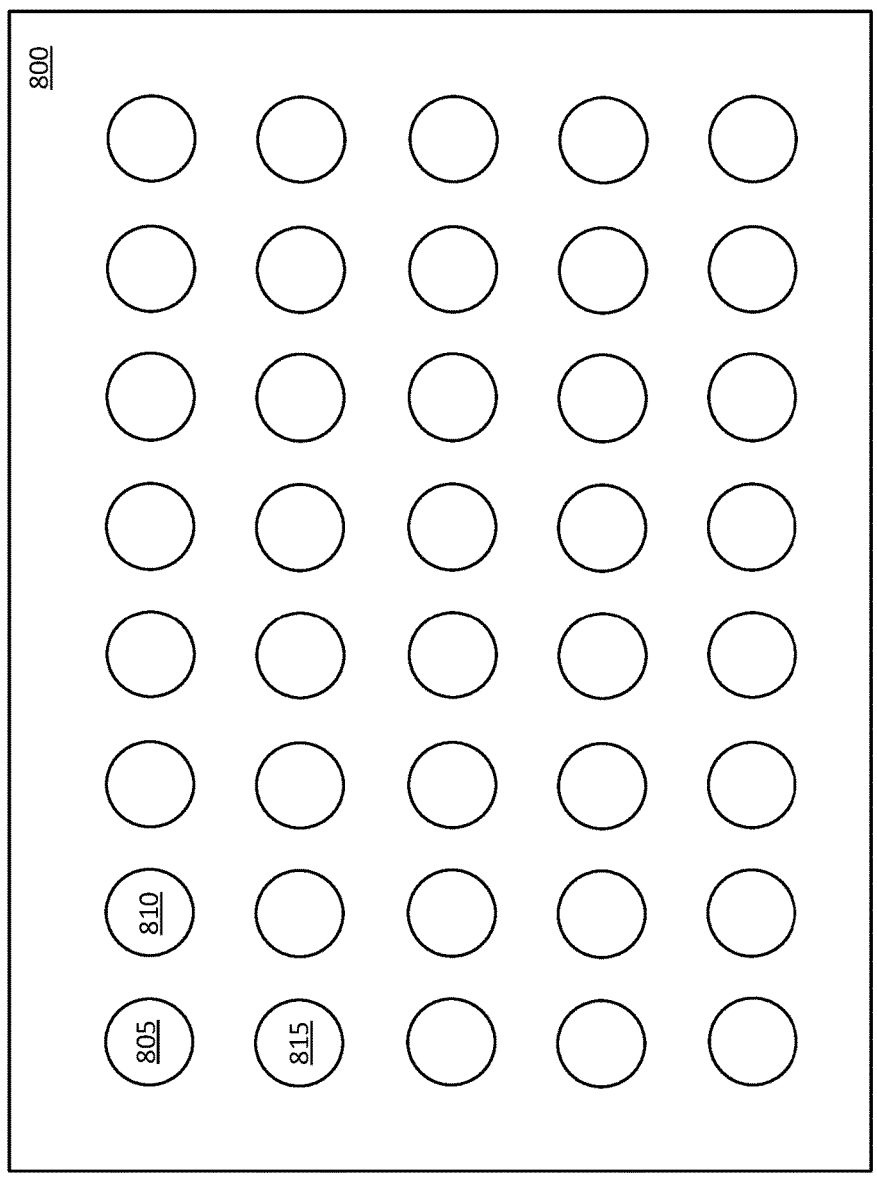
FIG. 8 shows a first exemplary perforated support sheet that can be used to support the thermal imaging sheet that is a part of the exemplary thermal imaging system shown in FIG. 1.
Figure 9:
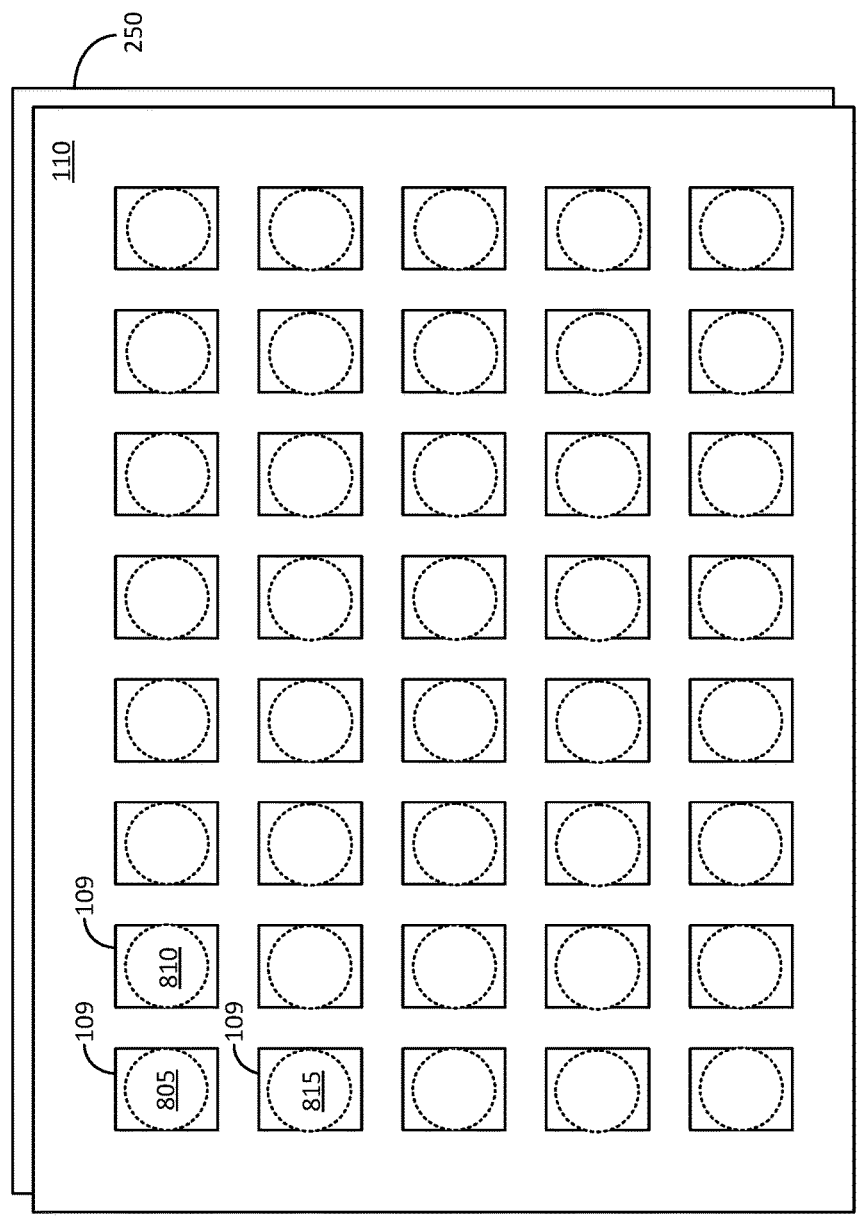
FIG. 9 shows the first exemplary perforated support sheet when arranged to support the thermal imaging sheet in accordance with an exemplary implementation of the disclosure.

FIG. 8 shows a first exemplary perforated support sheet 800 in accordance with an exemplary implementation of the support sheet 250 shown in FIG. 2. The perforated support sheet 800, which can be a plastic sheet or a polyimide sheet (a Kapton sheet, for example), may be attached to the thermal imaging sheet 110 (as shown in FIG. 9) in accordance with an exemplary implementation the disclosure. The perforated support sheet 800 has an array of circular perforations (such as a circular perforation 805, a circular perforation 810, and a circular perforation 815) that are aligned with an array of thermal unit cells 109 provided on the front surface 111 of the thermal imaging sheet 110. The diameter of each circular perforation is selected to be equal to or less than a width and/or a height of the footprint area occupied by a thermal unit cell 109 on the front surface 111 of the thermal imaging sheet 110. In an alternative implementation of the perforated support sheet 800, each perforation can have other shapes such as a square shape, a rectangular shape, a polygon shape, or an oval shape. The perforations provided in the perforated support sheet 800 reduce lateral heat conduction in the perforated support sheet 800, thereby increasing dT (the differential temperature rise) portion of Equation 1 shown above.

Figure 10:
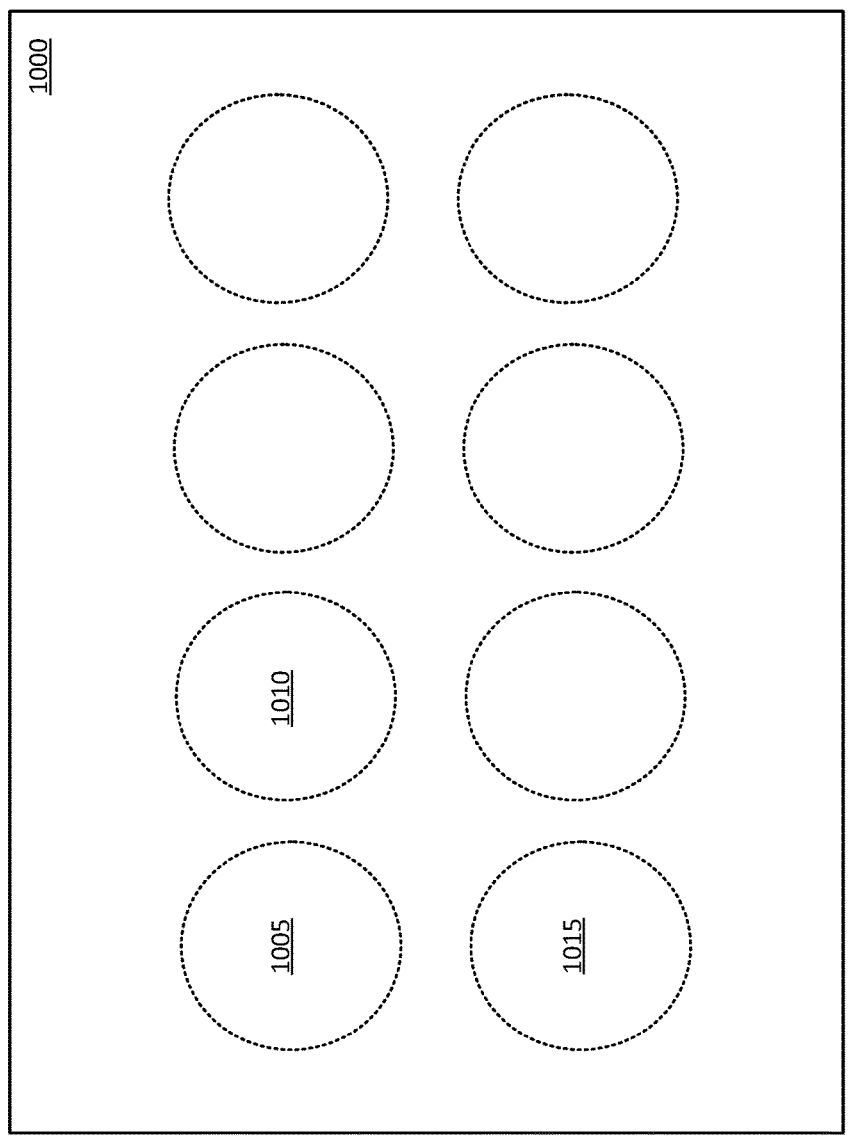
FIG. 10 shows a second exemplary perforated support sheet when arranged to support the thermal imaging sheet in accordance with another exemplary implementation of the disclosure.
Figure 11:
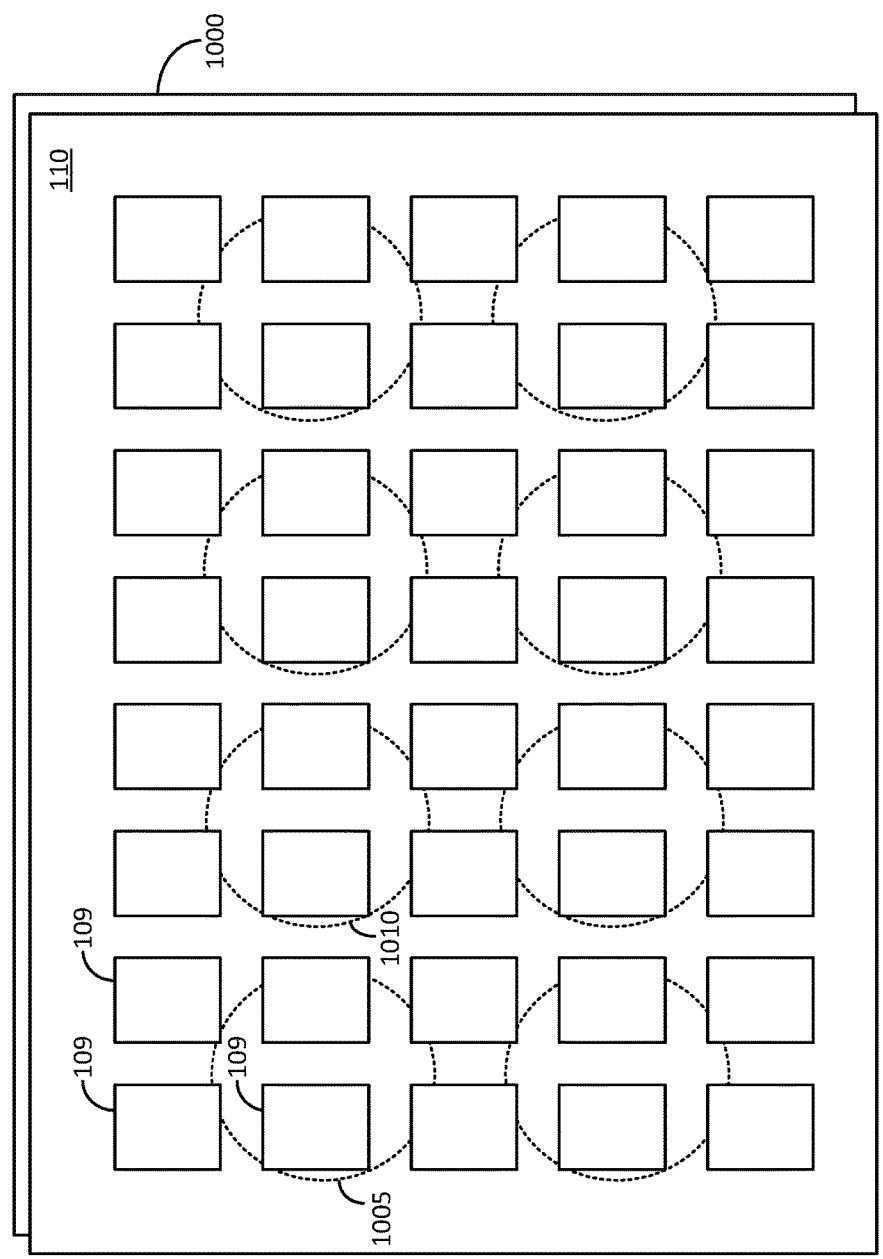
FIG. 11 shows the second exemplary perforated support sheet when arranged to support the thermal imaging sheet in accordance with an exemplary implementation of the disclosure.

FIG. 10 shows a second exemplary perforated support sheet 1000 in accordance with another exemplary implementation of the support sheet 250 shown in FIG. 2. The perforated support sheet 1000, which can be a plastic sheet or a polyimide sheet (a Kapton sheet, for example), may be attached to the thermal imaging sheet 110 (as shown in FIG. 11) in accordance with an exemplary implementation the disclosure. The exemplary perforated support sheet 1000 has an array of circular perforations (such as a circular perforation 1005, a circular perforation 1010, and a circular perforation 1015) each having a diameter that is greater than the footprint area occupied by a thermal unit cell 109 on the front surface 111 of the thermal imaging sheet 110. In an alternative implementation of the second exemplary perforated support sheet 1000, each perforation can have other shapes such as a square shape, a rectangular shape, a polygon shape, or an oval shape.

Figure 12:
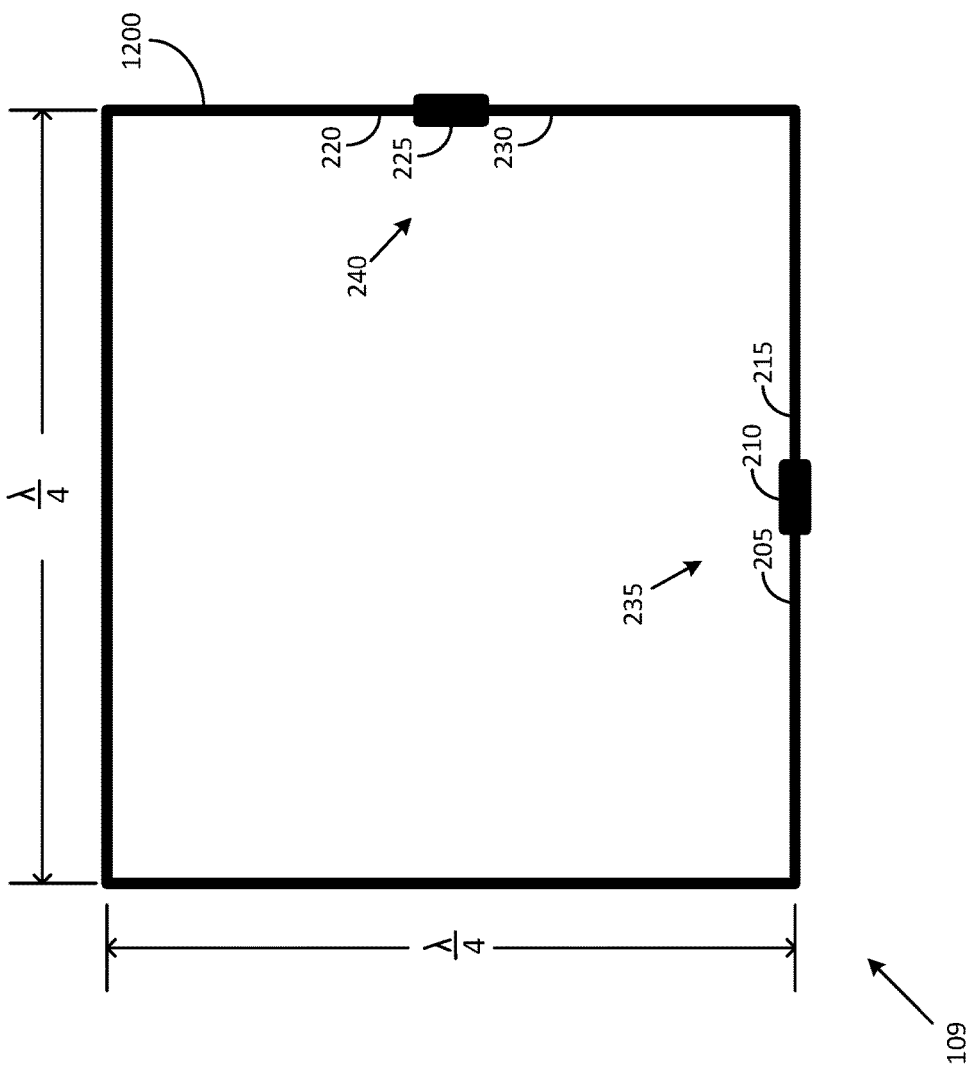
FIG. 12 shows a third exemplary thermal unit cell that can be provided upon the thermal imaging sheet that is a part of the exemplary thermal imaging system shown in FIG. 1.

FIG. 12 shows a third exemplary embodiment of the thermal unit cell 109 that can be provided on the front surface 111 of the thermal imaging sheet 110 shown in FIG. 1. In this embodiment, the thermal unit cell 109 is implemented as a four-sided loop antenna 1200 having a square profile. In other embodiments, the loop antenna 1200 can have other profiles subject to at least a first side being orthogonal to a second side.

The four-sided loop antenna 1200, which is a square loop antenna in this example, has a first side that includes the first conductor 205, the second conductor 215, and the first terminating resistor 210 connected between adjacent ends of the first conductor 205 and the second conductor 215. This arrangement is similar to that of the first RF antenna 235 shown in FIG. 2. The four-sided loop antenna 1200 has a second side that includes the third conductor 220, the fourth conductor 230, and the second terminating resistor 225 connected between adjacent ends of the third conductor 220 and the fourth conductor 230. This arrangement is similar to that of the second RF antenna 240 shown in FIG. 2.

A length of each of the four sides of the four-sided loop antenna 1200 is selected in accordance with an operating wavelength of the RF signal. For example, the length of each of the four sides of the four-sided loop antenna 1200 can be selected to be directly proportional to a quarter-wave length ($\lambda/4$) of the RF signal, whereby the cumulative length of all four sides is directly proportional to one wavelength of the RF signal.

Figure 13:
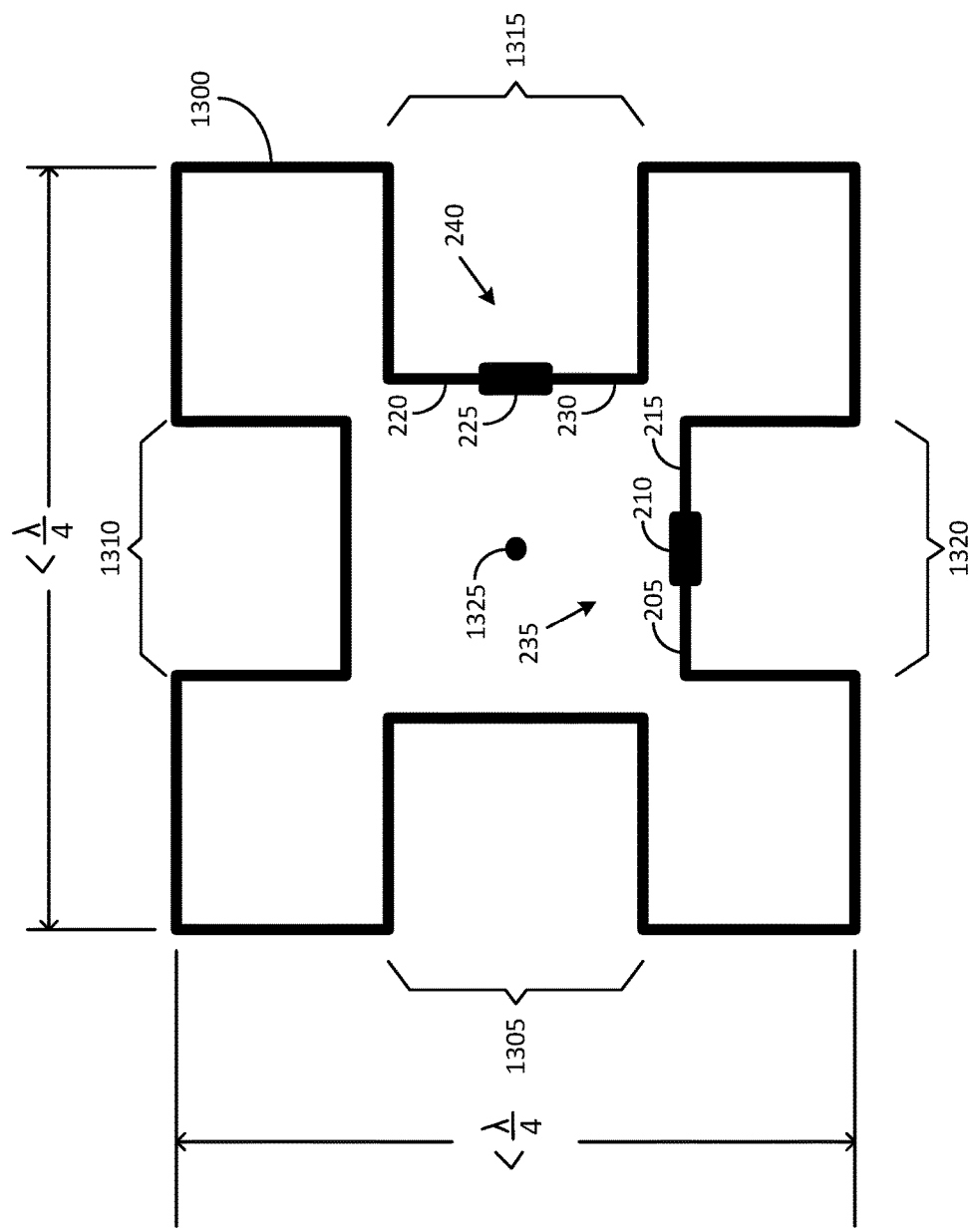
FIG. 13 shows a fourth exemplary thermal unit cell that can be provided upon the thermal imaging sheet that is a part of the exemplary thermal imaging system shown in FIG. 1.

FIG. 13 shows a fourth exemplary embodiment of the thermal unit cell 109 that can be provided on the front surface 111 of the thermal imaging sheet 110 shown in FIG. 1. In this embodiment, the thermal unit cell 109 is implemented as a four-sided loop antenna 1300 having a square profile with one crenellation in each side of the square profile. In other embodiments, the loop antenna 1300 can have other profiles and indentations other than in the form of crenellations.

The crenellations provided on the sides of the four-sided loop antenna 1300 reduce a surface area occupied by the four-sided loop antenna 1300 upon the thermal imaging sheet 110 in comparison to a surface area occupied by the four-sided loop antenna 1200. The surface area occupied by the four-sided loop antenna 1300 will be less than a square of quarter-wave length ($\lambda/4$) of the RF signal in comparison to the surface area occupied by the four-sided loop antenna 1200 that is equal to a square of quarter-wave length ($\lambda/4$) of the RF signal.

The four-sided loop antenna 1300 has a first crenellation 1320 having a first section that includes a portion of the first conductor 205, a portion of the second conductor 215, and the first terminating resistor 210 connected between adjacent ends of the first conductor 205 and the second conductor 215. The first section of the first crenellation 1320 is a horizontal section that is located closest to a center 1325 of the four-sided loop antenna 1300.

The four-sided loop antenna 1300 also has a second crenellation 1315 having a second section that includes a portion of the third conductor 220, a portion of the fourth conductor 230, and the second terminating resistor 225 connected between adjacent ends of the third conductor 220 and the fourth conductor 230. The second section of the second crenellation 1315 is a vertical section that is located closest to the center 1325 of the four-sided loop antenna 1300.

Figure 14:
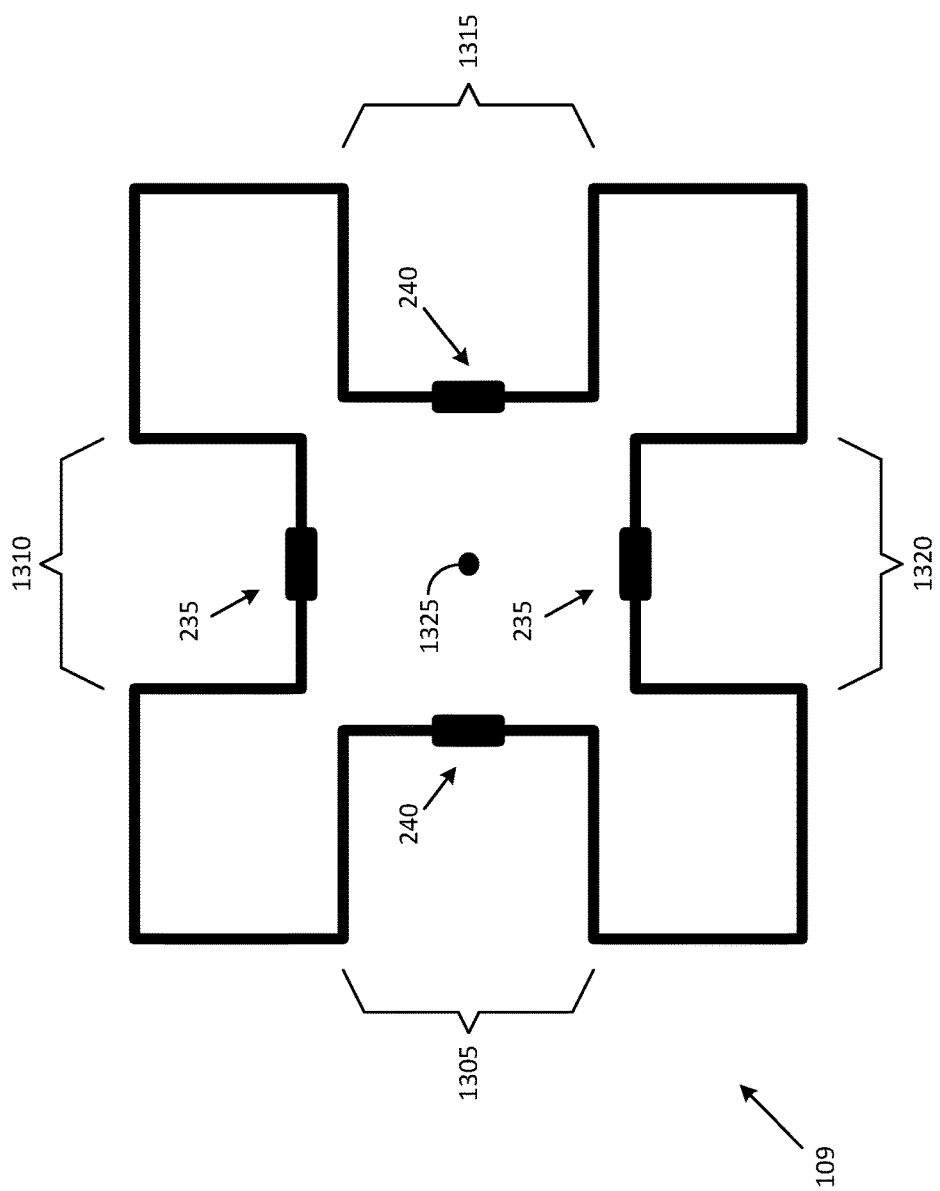
FIG. 14 shows an alternative embodiment of the fourth exemplary thermal unit cell that is shown in FIG. 13.

FIG. 14 shows an alternative embodiment of the thermal unit cell 109 shown in FIG. 13. In this embodiment, the four-sided loop antenna 1300 has a third crenellation 1310 having a third section that includes a portion of the first conductor 205, a portion of the second conductor 215, and the first terminating resistor 210 connected between adjacent ends of the first conductor 205 and the second conductor 215. The third section of the third crenellation 1310 is a horizontal section that is located closest to a center 1325 of the four-sided loop antenna 1300. The first terminating resistor 210 provided in the third section generates a horizontal hotspot that is substantially parallel to a horizontal hotspot generated by the first terminating resistor 210 provided in the first section of the first crenellation 1320.

The four-sided loop antenna 1300 also has a fourth crenellation 1305 having a fourth section that includes a portion of the third conductor 220, a portion of the fourth conductor 230, and the second terminating resistor 225 connected between adjacent ends of the third conductor 220 and the fourth conductor 230. The fourth section of the fourth crenellation 1305 is a vertical section that is located closest to the center 1325 of the four-sided loop antenna 1300. The first terminating resistor 210 provided in the fourth section generates a vertical hotspot that is substantially parallel to a vertical hotspot generated by the first terminating resistor 210 provided in the second section of the second crenellation 1315.

In summary, it should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. Persons of skill in the art will understand that many such variations can be made to the illustrative embodiments without deviating from the scope of the invention.

What is claimed is:

1. A thermal imaging system comprising an infrared imaging camera, the thermal imaging system comprising: a thermal imaging sheet that generates a thermal footprint in response to a radio-frequency (RF) signal incident upon an array of thermal unit cells located on the thermal imaging sheet, the thermal footprint comprising an array of hotspots, each thermal unit cell in the array of thermal unit cells comprising a first RF antenna having a first conductor, a second conductor, and a first terminating resistor connected between adjacent ends of the first conductor and the second conductor, wherein the first terminating resistor generates a first hotspot on a rear surface of the thermal imaging sheet.

2. The thermal imaging system of claim 1, wherein the each of the array of thermal unit cells further comprises a second RF antenna having a third conductor, a fourth conductor, and a second terminating resistor connected between adjacent ends of the third conductor and the fourth conductor.

3. The thermal imaging system of claim 2, wherein the first RF antenna is a first RF dipole antenna and the second RF antenna is a second RF dipole antenna.

4. The thermal imaging system of claim 2, wherein a longitudinal axis of each the first conductor and the second conductor is aligned with a first polarization component of the RF signal that is incident upon the thermal imaging sheet, and a longitudinal axis of each of the third conductor and the fourth conductor is aligned with a second polarization component of the RF signal that is incident upon the thermal imaging sheet.

5. The thermal imaging system of claim 4, wherein the thermal imaging sheet is a plastic sheet; wherein each of the first conductor, the second conductor, the third conductor, and the fourth conductor comprises at least one of a noble metal or an alloy deposited upon the plastic sheet; and wherein each of the first terminating resistor and the second terminating resistor is a surface mount resistor mounted upon the plastic sheet.

6. The thermal imaging system of claim 2, further comprising: wherein the infrared (IR) imaging camera is arranged to capture an infra red image of the thermal footprint generated on the thermal imaging sheet, the array of hotspots comprising a first hotspot generated on the thermal imaging sheet by the first terminating resistor and a second hotspot generated on the thermal imaging sheet by the second terminating resistor.

7. The thermal imaging system of claim 6, further comprising a perforated support sheet attached to the thermal imaging sheet.

8. A thermal imaging system comprising an infrared imaging camera, the thermal imaging system comprising: a thermal imaging sheet comprising an array of thermal unit cells that generate a thermal footprint in response to a radio-frequency (RF) signal received from an RF antenna, the thermal footprint comprising a first set of hotspots that indicate a radiation characteristic of a first polarization component of the RF signal, and a second set of hotspots that indicate a radiation characteristic of a second polarization component of the RF signal, each thermal unit cell in the array of thermal unit cells comprising: a first conductor, a second conductor, and a first terminating resistor connected between adjacent ends of the first conductor and the second conductor, wherein the first terminating resistor generates a first hotspot on a rear surface of the thermal imaging sheet; and a third conductor, a fourth conductor, and a second terminating resistor connected between adjacent ends of the third conductor and the fourth conductor.

9. The thermal imaging system of claim 8, wherein the first conductor, the second conductor, and the first terminating resistor are configured to operate as a first dipole antenna, and wherein the third conductor, the fourth conductor, and the second terminating resistor are configured to operate as a second dipole antenna.

10. The thermal imaging system of claim 9, wherein a first longitudinal axis of each of the first conductor and the second conductor is aligned with a first horizontal axis on the thermal imaging sheet, and a second longitudinal axis of each of the third conductor and the fourth conductor is aligned with a first vertical axis on the thermal imaging sheet.

11. The thermal imaging system of claim 9, wherein the first dipole antenna and the second dipole antenna are arranged in a T-configuration with respect to each other.

12. The thermal imaging system of claim 8, further comprising: wherein infrared (IR) imaging camera is arranged to capture an infrared image of the thermal footprint generated on the thermal imaging sheet; and a computer system communicatively coupled to the infrared imaging camera, the computer system configured to use one or more image processing techniques for evaluating the thermal footprint generated on the thermal imaging sheet.

13. The thermal imaging system of claim 12, wherein the computer system is configured to use location information of at least a portion of the array of thermal unit cells when evaluating the thermal footprint.

14. The thermal imaging system of claim 13, the computer system is further configured to use location information of each of the first terminating resistor and the second terminating resistor in each thermal unit cell in the at least the portion of the array of thermal unit cells.

15. The thermal imaging system of claim 8, wherein at least a portion of the first conductor and at least a portion of the second conductor are located on a first side of a four-sided loop antenna; and wherein at least a portion of the third conductor and at least a portion of the fourth conductor are located on a second side of the four-sided loop antenna, the second side orthogonal to the first side.

16. The thermal imaging system of claim 15, wherein the four-sided loop antenna is a square loop antenna having a first crenellation on the first side and a second crenellation on the second side, the first terminating resistor mounted on a section of the first crenellation that is closest to a center of the square loop antenna, and the second terminating resistor mounted on a section of the second crenellation that is closest to the center of the square loop antenna.

17. A method for thermal imaging using an infrared imaging camera, the method comprising:
receiving a radio-frequency (RF) signal on a thermal imaging sheet of a thermal imaging system; and
generating a first thermal footprint on the thermal imaging sheet in response to receiving the RF signal, the first thermal footprint comprising a pair of hotspots generated by a thermal unit cell, the thermal unit cell comprising:
a first RF antenna having a first conductor, a second conductor, and a first terminating resistor connected between adjacent ends of the first conductor and the second conductor, wherein the first terminating resistor generates a first hotspot in the pair of hotspots; and
a second RF antenna having a third conductor, a fourth conductor, and a second terminating resistor connected between adjacent ends of the third conductor and the fourth conductor, the second RF antenna arranged in a T-configuration with respect to the first RF antenna, wherein the second terminating resistor generates a second hotspot in the pair of hotspots.

18. The method of claim 17, further comprising:
executing an evaluation procedure for evaluating at least a first wireless device that is used to transmit the RF signal towards the thermal imaging sheet, the evaluation procedure comprising comparing the first thermal footprint to a template thermal footprint, the template thermal footprint indicative of one of a normal radiation characteristic of the RF signal or an abnormal radiation characteristic of the RF signal.

19. The method of claim 18, wherein the first wireless device is one of a plurality of wireless devices in a production line of a manufacturing facility, and wherein the evaluation procedure is a pass-fail evaluation procedure for evaluating the plurality of wireless devices.

20. The method of claim 18, further comprising:
generating the template thermal footprint by using at least one of a reference wireless device or a defective wireless device.

\* \* \* \* \*